United States Patent [19]
Carroll et al.

[11] Patent Number: 5,162,062
[45] Date of Patent: Nov. 10, 1992

[54] METHOD FOR MAKING MULTILAYER ELECTRONIC CIRCUITS

[75] Inventors: Alan F. Carroll, Raleigh, N.C.; Marc H. Labranche, Wilmington, Del.

[73] Assignee: E. I. Du Pont de Nemours and Company, Wilmington, Del.

[21] Appl. No.: 725,779

[22] Filed: Jun. 17, 1991

[51] Int. Cl.[5] ............................................. B23K 35/34
[52] U.S. Cl. ............................................. 148/24; 148/23
[58] Field of Search .................................... 148/23, 24

[56] References Cited

U.S. PATENT DOCUMENTS

| | | | |
|---|---|---|---|
| 4,090,009 | 5/1978 | Horowitz | 428/208 |
| 4,318,830 | 3/1982 | Horowitz | 252/519 |
| 4,332,343 | 6/1982 | Koopman | 148/23 |
| 4,381,945 | 5/1983 | Nair | 106/1.14 |
| 4,416,932 | 11/1983 | Nair | 428/209 |
| 4,636,332 | 1/1987 | Craig et al. | 252/514 |

Primary Examiner—Peter D. Rosenberg

[57] ABSTRACT

A method for making multilayer electronic circuits comprising the sequential steps of
(1) applying to a substrate comprising a plurality of alternating dielectric and conductive layers a thick film dielectric paste containing a low-melting silicate glass;
(2) applying to the dielectric paste layer a pattern of thick film conductor paste comprising finely divided particles of silver, an inorganic binder and a ruthenium- or rhodium-based sintering inhibitor, all dispersed in an organic medium; and
(3) air cofiring the applied layers of thick film dielectric and conductive pastes.

11 Claims, 1 Drawing Sheet

METHOD FOR MAKING MULTILAYER ELECTRONIC CIRCUITS

FIELD OF INVENTION

The invention is directed to a method for making multilayer electronic circuits using thick film pastes.

BACKGROUND OF THE INVENTION

Multilayer constructions are becoming of greater interest to the hybrid circuit manufacturers as circuits become increasingly complex, and the need for lower cost, higher line density circuits grows. Improvements in multilayer technology are critical to serving these growing demands.

There are several drivers in the marketplace. For example, lower cost is critical, which means a move to pure silver, platinum/silver, or copper metallurgies, as opposed to traditional gold or palladium/silver. Processing costs are equally important to the circuit manufacturer, so that minimizing the number of print and fire steps reduces the final circuit cost.

Finer line spacing is also necessary in the drive for miniaturization. Higher conductivity conductors are especially useful as the line widths shrink. Fortunately, this need is consistent with the trend to silver or copper metallizations.

Higher reliability dielectric layers are needed as the number of conductor crossovers in a circuit increases, especially with pure silver or copper conductors. For screen printed applications, customers increasingly want to move away from three print and fire steps to two or one for the dielectric in order to save processing costs. This trend has led to the development of more reliable, crystallizing glass systems. The crystallizing glasses are much more stable after firing than standard filled lead-borosilicate type of systems because the crystallization prevents further glass softening and flow after additional firings. However, this same level of reliability and stability in the dielectric makes it more difficult to bond standard thick film conductors to the substrate. Aged adhesion is usually degraded when the conductors are fired over previously fired dielectric. This is because the glasses and fluxes in the conductor do not react as well with the crystallized glass beneath it, owing to the stability of the crystallized dielectric.

SUMMARY OF THE INVENTION

The invention is directed to a method for making multilayer electronic circuits comprising the sequential steps of:

(1) applying to the exposed surface of a substrate comprising a plurality of alternating layers of inorganic dielectric material and thick film conductor a layer of thick film dielectric paste comprising finely divided particles of an amorphous glass containing by weight at least 25% $SiO_2$ and having a softening point below the maximum firing temperature of step (3) hereinbelow;

(2) applying to the thick film dielectric layer of step (1) a patterned layer of thick film conductor paste comprising finely divided particles of (a) a silver-containing metal selected from Ag, alloys and mixtures of Ag with a minor amount of Pd and/or Pt and mixtures thereof, the silver-containing particles having a maximum particle size of 20 microns, a surface area of at least 0.1 $m^2/g$; (b) an amorphous glass binder having a Dilatometer softening point of 150–800 C. comprising at least two metal oxides selected from PbO, $B_2O_3$, $SiO_2$ and $Bi_2O_3$ and up to 45% wt. of glass modifier selected from oxides of alkali metals, alkaline earth metals, transition metals, and mixtures thereof, (c) a sintering inhibitor selected from oxides of ruthenium and rhodium, mixtures and precursors thereof, the amount of the sintering inhibitor relative to the amount of conductive metal falling within the area defined by points A through D of FIG. 1, all of (a), (b), and (c) being dispersed in an organic medium; and (3) air cofiring the applied layers of thick film dielectric and thick film conductive pastes to effect volatilization of the organic medium from both layers, softening of the glass binder and sintering of the metal particles in the thick film conductor layer and densification of the glass in the thick film dielectric layer.

BRIEF DESCRIPTION OF THE DRAWING

The drawing consists of a single FIGURE which is a graphical depiction of the proportions of the sintering inhibitors which are required with respect to the silver-containing conductive metal in the thick film conductive layer.

PRIOR ART

JPA Kokai 62/285314

Figure 1:
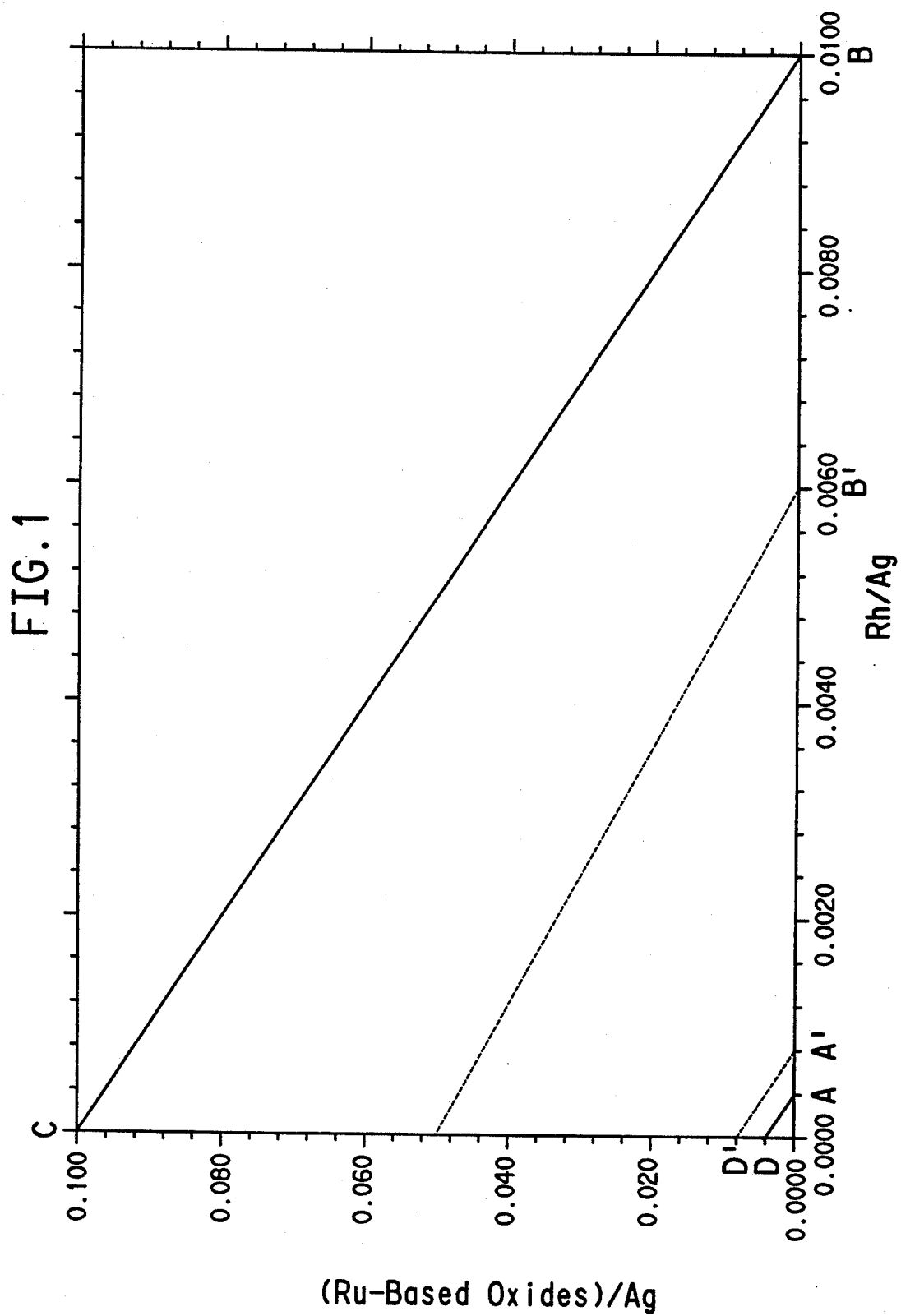

The published application discloses a thick film conductive paste comprising finely divided particles of silver and a low-melting glass frit dispersed in an organic medium containing a very small amount (ca. 5 ppm) of organic gold or rhodium.

JPA Kokai 57/27506

The published application discloses a thick film conductive paste comprising finely divided particles of silver, a low-melting glass frit and a binder dispersed in an organic medium containing small amounts (ca. 100 ppm) of organic rhodium.

DETAILED DESCRIPTION OF THE INVENTION

Broadly speaking the invention is directed to a technique for developing improved conductor aged adhesion over dielectric layers. It is suitable for both glassy and filled glass dielectric systems, as well as for crystallizing and filled crystallizing systems. It is especially useful for the crystallizing and filled crystallizing type of systems on account of the difficulty in bonding conductors to crystallized glass layers. The technique involves firing the conductor over the dielectric before the dielectric has fully crystallized. It can mean first firing the dielectric at a lower temperature, below its crystallization point, and then printing the conductor. However, it is especially useful when the conductor is printed directly over the printed dielectric, when the dielectric is in the green (unfired) state. Thus, the conductor and dielectric are fired together. This cofiring allows the conductor and dielectric glasses to flow together below the dielectric crystallization point, allowing a good bond to develop. After the bond develops, crystallization can occur at the peak firing temperatures, essentially stopping the reaction.

For ceramic filled, glass dielectric systems, little crystallization will occur at the peak firing temperature. In this case, cofiring can still allow for good bonding between the conductor and dielectric layers during the cofiring step. The crystallization is not needed for the bonding. However, cofiring is particularly useful for the crystallizing systems, as described below.

Cofiring the top conductor with the dielectric has other advantages. The number of firing steps is reduced, lowering the manufacturing costs for the final circuit. In particular, less belt furnaces are needed by the circuit maker, reducing capital expenditures. Also, the line resolution for the top layer conductors is significantly improved when printing over printed dielectric or over green tape. The improved resolution results from the rapid flow of solvent from the conductor into the dielectric layer, raising the local viscosity of the conductor and preventing spreading. Printing over glassy surfaces is more difficult, because the conductor tends to spread more over the smooth surface. Typically, top layer conductors are printed sequentially over fired dielectrics or cofired tape structures, so that the line resolution is degraded.

Thus, cofiring top layer conductor and green dielectric has the following advantages:
  Improved bonding of conductor to dielectric, especially for crystallizing dielectric chemistries
  Improved line definition for top layer conductor
  Reduced manufacturing cost because of less firing steps.

The invention is directed at providing a reliable bond between the soldered conductor layer and the adjacent underlying dielectric layer. The bond is designed to survive the penetration of tin metal from solder and still maintain high adhesion. To develop this bond more effectively, it is preferred that the conductor and dielectric compositions be cofired. The nature of this bond does not, however, depend upon the character of the circuitry and substrates beneath. Therefore, the top dielectric layer can be applied over a wide variety of substrates such as the following:
(1) on an alumina substrate directly;
(2) over alternating layers of previously fired conductor and/or dielectric layers; and
(3) over alternating layers of previously dried unfired conductor and/or dielectric layers.

Thus, while in the examples below, the compositions were tested by screen printing the dielectric layer directly upon alumina substrates, that configuration is exemplary of the many ways in which it can be applied and was chosen merely to simplify the testing procedure.

SILVER-CONTAINING CONDUCTOR

The invention is particularly useful for the application of silver-containing thick film pastes, that is, pastes in which the conductive metal is either silver or alloy of silver with minor amounts (up to 35 mole %) of metals such as platinum and palladium.

The maximum particle size of the silver-containing conductive phase must be no more than 20 microns and preferably is 10 microns or less. In addition, in order to insure uniformity of the film and to improve shrinkage match with the underlying substrate, it is preferred that the tap density of the conductive phase particles be at least 2 g/cc and preferably 3 g/cc and higher. The average surface areas of the conductive particles should be within the range of 0.1-3 $m^2/g$ and preferably 0.2-2 $m^2/g$.

INORGANIC BINDER

The inorganic binder for the thick film conductor paste must be a low softening point glass having a dilatomer softening point of 150°-800° C. In particular, the softening point of the glass should be such that it undergoes liquid phase sintering, i.e., it begins to flow, before the conductive metal component completes sintering and densification during cofiring. In addition, the inorganic binder must begin to flow before any crystallization takes place in the dielectric layer if it is crystallizable during the firing step. It is preferred that the softening point of the glass be in the range of 200°-600° C. It is also preferred that the surface area of the conductive metal particles be within the range of 0.1-3 $m^2/g$ and preferably from 0.2-2 $m^2/g$.

A wide range of glass compositions can be used as the inorganic binder of the thick film conductor so long as the above-mentioned criteria are fulfilled. In particular, amorphous silicates, borosilicates and borates of lead and bismuth have been found to be particularly suitable in combination with up to 50% by weight glass modifiers such as alkali metal oxides, alkaline earth metal oxides and transition metal oxide. Mixtures and precursors of these components may be used as well.

Optionally, the binder component may also contain supplemental fluxing agents such as $Bi_2O_3$ and PbO.

SINTERING INHIBITOR

Materials which can be used in the invention as sintering inhibitors for the conductive metal are the oxides of rhodium (Rh) and ruthenium (Ru) and those rhodium- and ruthenium-based compounds which under the firing conditions which they are subjected to are changed to the oxides of the metals. Such materials can be in either particulate form or in the form of organometallic compounds which are soluble in the organic medium. For example, suitable Ru-based materials include Ru metal, $RuO_2$, Ru-based pyrochlore compounds such as bismuth lead ruthenate, and copper bismuth ruthenate, Ru resinates and mixtures thereof. Suitable Rh-containing materials include Rh metal, $RhO_2$, $Rh_2O_3$, Rh resinates and mixtures thereof. The essential criterion of both classes of materials is that they either be oxides of Rh or Ru or that they be precursors of those oxides under air firing conditions of application.

Preferred sintering additive materials for use in the invention are $RuO_2$, copper bismuth ruthenate and Rh resinate. The use of particulate sintering inhibitors as well as soluble organometallic sintering inhibitors is illustrated in the examples. Nevertheless, it should be recognized that the inhibitors can also be present in the form of a coating on the conductive metal particles. Such coatings can be produced by dispersing the conductive metal particles in a solution of a resinate of the metal of the sintering inhibitor, removing the bulk of the liquid from the dispersion and then drying the particles to form an oxide coating.

ORGANIC MEDIUM

The inorganic particles are mixed with an essentially inert liquid medium (vehicle) by mechanical mixing (e.g., on a roll mill) to form a pastelike composition having suitable consistency and rheology for screen printing. The latter is printed as a "thick film" on conventional dielectric substrates in the conventional manner.

Any inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineol and the like, solutions of resins such as the polymethacrylates of lower alcohols and solutions of ethyl cellulose in solvents such as pine oil and the monobutyl ether of ethylene glycol monoacetate. A preferred vehicle is based on ethyl cellulose and beta-terpineol. The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage, the dispersions will contain complementally 60-90% solids and 40-10% vehicle. The compositions of the present invention may, of course, be modified by the addition of other materials which do not affect its beneficial characteristics. Such formulation is well within the skill of the art.

The pastes are conveniently prepared on a three-roll mill. The viscosity of the pastes is typically within the following ranges when measured on a Brookfield HBT viscometer at low, moderate and high shear rates:

| Shear Rate ($sec^{-1}$) | Viscosity (Pa · s) | |
|---|---|---|
| 0.2 | 100-5000 | |
|  | 300-2000 | Preferred |
|  | 600-1500 | Most Preferred |
| 4 | 40-400 | |
|  | 100-250 | Preferred |
|  | 120-200 | Most Preferred |
| 40 | 10-150 | |
|  | 25-120 | Preferred |
|  | 50-100 | Most Preferred |

The amount of vehicle utilized is determined by the final desired formulation viscosity.

FORMULATION AND APPLICATION

In the preparation of the compositions of the present invention, the particulate inorganic solids are mixed with the organic carrier and dispersed with suitable equipment, such as a three-roll mill, to form a suspension, resulting in a composition for which the viscosity will be in the range of about 100-250 pascal-seconds at a shear rate of 4 $sec^{-1}$.

In the examples which follow, the formulation was carried out in the following manner:

The ingredients of the paste, minus about 5% organic components equivalent to about 5% wt., are weighed together in a container. The components are then vigorously mixed to form a uniform blend; then the blend is passed through dispersing equipment, such as a three-roll mill, to achieve a good dispersion of particles. A Hegman gauge is used to determine the state of dispersion of the particles in the paste. This instrument consists of a channel in a block of steel that is 25 μm deep (1 mil) on one end and ramps up to 0" depth at the other end. A blade is used to draw down paste along the length of the channel. Scratches will appear in the channel where the agglomerates' diameter is greater than the channel depth. A satisfactory dispersion will give a fourth scratch point of 10-18 typically. The point at which half of the channel is uncovered with a well dispersed paste is between 3 and 8 typically. Fourth scratch measurement of >20 μm and "half-channel" measurements of >10 μm indicate a poorly dispersed suspension.

The remaining 5% consisting of organic components of the paste is then added, and the resin content is adjusted to bring the viscosity when fully formulated to between 140 and 200 Pa.s at a shear rate of 4 $sec^{-1}$. The composition is then applied to the dried unfired dielectric layer, usually by the process of screen printing, to a wet thickness of about 30-80 microns, preferably 35-70 microns, and most preferably 40-50 microns. The electrode compositions of this invention can be printed onto the dielectric layer either by using an automatic printer or a hand printer in the conventional manner, preferably automatic screen stencil techniques are employed using a 200-to 325-mesh screen. The printed pattern is then dried at below 200° C., about 150 C., for about 5-15 minutes before firing. Firing to effect sintering of both the inorganic binder and the finely divided particles of metal is preferably done in a well ventilated belt conveyor furnace with a temperature profile that will allow burnout of the organic matter at about 300°-600° C., a period of maximum temperature of about 700°-1000° C. lasting about 5-15 minutes, followed by a controlled cooldown cycle to prevent over sintering, unwanted chemical reactions at intermediate temperatures or substrate fracture which can occur from too rapid cooldown. The overall firing procedure will preferably extend over a period of about 1 hour, with 20-25 minutes to reach the firing temperature, about 10 minutes at the firing temperature and about 20-25 minutes in cooldown. In some instances, total cycle times as short as 30 minutes or less can be used.

EXAMPLES

A standard 1"×1" Du Pont adhesion pattern was used in this study (see Du Pont Technical Service Monographs C-7 and C-8). It consists of 2 mm×2 mm bond pads, plus a serpentine line 0.5 mm×100 mm. After firing, the solder leach resistance was determined by the number of 10 sec dips the fired layer could withstand in 62/36/2 Sn/Pb/Ag solder at 230 C. before the serpentine line showed a discontinuity. A mildly active flux such as Alpha 611 was used. This break in the solder on the serpentine was due either to leaching of the metal into the solder reservoir, or to dewetting of the serpentine line by the solder.

Aged adhesion measurements were performed on the 2 mm square pads, using pretinned, 20 gauge wire, the 62/36/2 solder and a mildly active Alpha 611 flux. Aging was performed at 150° C. through 1000 hours. Parts were pulled with an automated Instron® pull tester, employing a standard 90° peel orientation. Pull rate (crosshead speed) was 0.5 inch/minute.

Fired thicknesses in these examples were 10-12 microns. Parts were fired 2× at 850° C. using a 30 min. profile.

The glass frit compositions used for the conductors in this study, including the frit Dilatometer softening points, are listed in Table 1. The properties of the silver powders used in the conductor examples are shown in Table 2. Composition of the dielectric glasses are given in Table 3. Composition of the dielectric pastes are given in Table 4, and the conductor formulations and test data are given in Table 5.

TABLE 1

Conductor Glass Frit Compositions

| Frit Designation | F | G | H | I |
|---|---|---|---|---|
| Bi₂O₃ | | 50.5 | 77.5 | 60 |
| PbO | 80.6 | 42.4 | 7.5 | 37 |
| B₂O₃ | 12.0 | 3.6 | | 3 |
| SiO₂ | 6.0 | 3.5 | 15.0 | |
| Al₂O₃ | | | | |
| ZnO | 1.4 | | | |
| CaO | | | | |
| SnO₂ | | | | |
| BaO | | | | |
| Softening Point, °C. | 365 | <350 | 490 | 285 |

| Frit Designation | J | K | L | M |
|---|---|---|---|---|
| Bi₂O₃ | 49 | 96.4 | | |
| PbO | 30 | | 43.5 | 24.5 |
| B₂O₃ | 4 | 3.6 | 4.8 | 16.3 |
| SiO₂ | 16 | | 37.5 | 9.3 |
| Al₂O₃ | 1 | | 4.4 | |
| ZnO | | | | 47.8 |
| CaO | | | 9.8 | |
| SnO₂ | | | | 1.1 |
| BaO | | | | 1.0 |
| Softening Point, °C. | <500 | <500 | 720 | 560 |

TABLE 2

Silver Powder Properties

| Silver Powder | Surface Area* (m²/g) | Tap Density** (g/cc) | Morphology |
|---|---|---|---|
| A | 1.2 | 2.2 | Uniaxed |
| B | 0.8 | 4.0 | Flake |
| C | 3.2 | 0.7 | Agglomerated |

*Surface area by B.E.T. Quantachrome Monosorb.
**Tap density by Tap-Pak Volumeter, ASTM B527-85.

TABLE 3

Dielectric Glass Compositions

| Component | % Wt. N | O | P | Q | R |
|---|---|---|---|---|---|
| SiO₂ | 35.4 | 42.0 | 41.1 | 35.9 | 35.8 |
| BaO | 6.0 | 5.9 | 2.7 | 6.2 | 22.7 |
| CaO | 18.0 | 18.8 | 22.4 | 18.3 | 7.2 |
| ZnO | 36.5 | 22.3 | 31.4 | 37.1 | 21.8 |
| ZrO₂ | 2.4 | 2.9 | 1.4 | 2.5 | 3.7 |
| AlPO₄ | 1.7 | | | | |
| SrO | | 4.0 | 0.7 | | |
| Al₂O₃ | | 4.0 | 0.2 | | 8.8 |
| Properties | | | | | |
| Softening Point, °C. | 741 | 799 | 760 | 749 | 811 |
| Crystallization Temp., °C. | 859 | 970 | 876 | 838 | 890 |

TABLE 4

Dielectric Paste Formulations

| | S | T | U | V | W | X | Y |
|---|---|---|---|---|---|---|---|
| Dielectric Glass N | 94.6 | | | | | | |
| Dielectric Glass O | | 39.6 | | | | | |
| Dielectric Glass P | | 39.6 | | | | | |
| Dielectric Glass Q | | | 100 | | | | |
| Dielectric Glass R | | | | 100 | | | |
| Zircon, ZrSiO₄, Powder | 5.0 | | | | | | |
| Alumina, 0.7 μm Mean | | 19.8 | | | | | |
| Cobalt Chrome Aluminate Colorant | 0.4 | 1.0 | | | | | |
| Du Pont QS482 | | | | | 1 | 100 | |
| Asahi AP5576 | | | | | | | 100 |

TABLE 4-continued

Dielectric Paste Formulations

| | S | T | U | V | W | X | Y |
|---|---|---|---|---|---|---|---|
| Du Pont 5704 | | | | | | | 100 |

Dielectrics S-V were formulated to have approximately 76% by weight solids in the paste, with the ratio of inorganic species shown above. The balance (approximately 24% by weight) was organic medium. Dielectrics W, X, and Y were commercially available thick film pastes: QS482, crystallizing dielectric thick film paste, Du Pont; AP5576, crystallizing dielectric thick film paste, Asahi Glass; and 5704, filled glass dielectric thick film paste, Du Pont.

TABLE 5

Conductor Formulations and Properties

| Example No. | 1 | 2 | 3 | 4 |
|---|---|---|---|---|
| Conductor Glass Frit | F | F | G | H |
| Frit/Ag | 0.027 | 0.013 | 0.016 | 0.060 |
| (Added Bi₂O₃)/Ag | 0.013 | 0.013 | 0 | 0 |
| Silver Type | A | A | B | B |
| Pt/Ag | 0 | 0 | 0 | 0 |
| Pd/Ag | 0 | 0 | 0 | 0.089 |
| Pyrochlore/Ag | 0 | 0 | 0 | 0.037 |
| RuO₂/Ag | 0 | 0.021 | 0 | 0 |
| Ru-Resinate/Ag | 0 | 0 | 0.025 | 0 |
| (Total Ru-Bearing Oxides)/Ag | 0 | 0.021 | 0.005 | 0.037 |
| Rh-Resinate/Ag | 0 | 0 | 0 | 0 |
| Rh/Ag | 0 | 0 | 0 | 0 |
| Dielectric | S | S | S | T |
| Cofired Aged Adhesion | <10N | 26N | 17N | 30N |
| Sequential Aged Adhesion | <10N | <10N | <10N | <10N |
| Leach Resistance | 1-2 Dips | 3 Dips | 3 Dips | 4 Dips |

| Example No. | 5 | 6 | 7 | 8 |
|---|---|---|---|---|
| Conductor Glass Frit | G | I | J + G | K |
| Frit/Ag | 0.016 | 0.038 | 0.013 + 0.0045 | 0.039 |
| (Added Bi₂O₃)/Ag | 0 | 0 | 0 | 0 |
| Silver Type | B | A | B | A |
| Pt/Ag | 0 | 0 | 0.0052 | 0 |
| Pd/Ag | 0 | 0 | 0 | 0 |
| Pyrochlore/Ag | 0 | 0.0078 | 0.0077 | 0.0078 |
| RuO₂/Ag | 0 | 0 | 0 | 0 |
| Ru-Resinate/Ag | 0 | 0 | 0 | 0 |
| (Total Ru-Bearing Oxides)/Ag | 0 | 0.0078 | 0.0077 | 0.0078 |
| Rh-Resinate/Ag | 0.019 | 0.013 | 0.013 | 0.013 |
| Rh/Ag | 0.0019 | 0.0013 | 0.0013 | 0.0013 |
| Dielectric | T | S | T | U |
| Cofired Aged Adhesion | 27N | 29N | 29N | 21N |
| Sequential Aged Adhesion | <10N | <10N | <10N | <10N |
| Leach Resistance | 4 Dips | 3 Dips | 3-4 Dips | 2 Dips |

| Example No. | 9 | 10 | 11 | 12 |
|---|---|---|---|---|
| Conductor Glass Frit | L | M | F | F |
| Frit/Ag | 0.039 | 0.039 | 0.039 | 0.039 |
| (Added Bi₂O₃)/Ag | 0.0079* | 0.0079* | 0.0079* | 0.0079* |
| Silver Type | A | A | A | A |
| Pt/Ag | 0 | 0 | 0 | 0 |
| Pd/Ag | 0 | 0 | 0 | 0 |
| Pyrochlore/Ag | 0 | 0.0079 | 0.0079 | 0.0079 |
| RuO₂/Ag | 0 | 0 | 0 | 0 |
| Ru-Resinate/Ag | 0 | 0 | 0 | 0 |
| (Total Ru-Bearing Oxides)/Ag | 0 | 0.0079 | 0.0079 | 0.0079 |
| Rh-Resinate/Ag | 0.013 | 0.013 | 0.013 | 0.013 |
| Rh/Ag | 0.0013 | 0.0013 | 0.0013 | 0.0013 |
| Dielectric | U | U | U | V |
| Cofired Aged Adhesion | 16N | <10N | 32N | 24N |
| Sequential Aged Adhesion | <10N | <10N | <10N | <10N |
| Leach Resistance | 1 Dip | 1 Dip | 2 Dips | 2 Dips |

| Example No. | 13 | 14 | 15 | 16 |
|---|---|---|---|---|
| Conductor Glass Frit | G | F | F | G |
| Frit/Ag | 0.026 | 0.013 | 0.013 | 0.027 |
| (Added Bi₂O₃)/Ag | 0 | 0.013 | 0.013 | 0 |
| Silver Type | B | B | B | C |
| Pt/Ag | 0 | 0 | 0 | 0 |

TABLE 5-continued

| Conductor Formulations and Properties | | | | |
|---|---|---|---|---|
| Pd/Ag | 0 | 0 | 0 | 0 |
| Pyrochlore/Ag | 0.0026 | 0 | 0 | 0 |
| RuO2/Ag | 0 | 0.021 | 0.021 | 0.027 |
| Ru-Resinate/Ag | 0 | 0 | 0 | 0 |
| (Total Ru-Bearing Oxides)/Ag | 0.026 | 0.021 | 0.021 | 0.027 |
| Rh-Resinate/Ag | 0 | 0 | 0 | 0 |
| Rh/Ag | 0 | 0 | 0 | 0 |
| Dielectric | W | X | Y | S |
| Cofired Aged Adhesion | 25N | 24N | 27N | Some Curling |
| Sequential Aged Adhesion | <10N | <10N | 27N | <10N |
| Leach Resistance | 2 Dips | 3 Dips | 3 Dips | — |

*$Bi_2O_3$ introduced as Bi-resinate (30% Bi).

Typically, it is more difficult to bond to crystallizing glasses than to amorphous glass dielectrics. This is especially true for crystallizing dielectrics with reduced silica contents, below about 50% $SiO_2$. In Example 1, a conductor is formulated with silver powder, low softening glass frit, and bismuth oxide. The aged adhesion is very low when fired over a separately fired crystallizing dielectric, and is also very low when cofired over such a dielectric.

Significantly improved aged adhesion is obtained in Example 2, when the composition includes $RuO_2$ sintering inhibitor, and when the conductor and dielectric are cofired together. The same glass system is employed as in Example 1. A precursor for $RuO_2$ is used in Example 3—ruthenium resinate. This shows that improved cofired aged adhesion effect can be obtained from the resinate precursor. The long term aged adhesion did not exceed 20N, but the total Ru content was not very high; additional ruthenium resinate would further improve aged adhesion. In Example 4, ruthenium is present as the pyrochlore compound copper-bismuth ruthenate. Again, the cofired aged adhesion is significantly improved compared to firing the conductor and dielectric sequentially.

It can also be seen from Examples 2–4 that solder leach resistance is improved. The addition of the Ru precious metal has the added advantage of improved solder leach resistance both because it reduces the rate of dissolution of the silver and also because it allows the use of lower glass levels in the conductor formulation to obtain adequate aged adhesion. High glass levels in silver compositions are known to reduce solderability and solder leach resistance because of dewetting.

The sintering inhibitor can be based on rhodium as well as ruthenium, as shown in Example 5 where rhodium resinate is employed. In either case, the dispersion of rhodium or ruthenium is expected to lead to a precious metal oxide dispersion during firing that will interfere with the sintering of the silver particles, allowing for a higher amount of silver/glass contact area after the firing step, and hence improved bonding.

Both rhodium and ruthenium can be employed together as the sintering inhibitors, as show in Example 6 where rhodium resinate and copper-bismuth ruthenate are both used. Similar improvements in cofired aged adhesion vs. sequential fired adhesion are observed.

The claimed technique of formulating with low softening point glasses plus ruthenium or rhodium-based sintering inhibitors is especially useful for pure silver compositions, since it is difficult to employ high levels of glass binder in pure silver pastes because of severely degraded solderability. However, the technique is not limited to silver compositions. A silver/palladium formulation is disclosed in Example 4, while a silver/platinum composition is disclosed in Example 7, both of which show the improved performance. Similar behavior is expected for gold and gold alloy systems.

In general, the best conductor glass compositions for the cofire bonding process are low softening point glasses based on Bi, Pb, B, and/or Si. Examples of lead borosilicate, bismuth-lead borosilicate, bismuth-lead silicate, and bismuth-lead borate glasses are found in previously described Examples 1–7. A bismuth borate composition is shown in Example 8. Further, these glasses can be blended, as shown in Example 7. The low softening points are useful to develop interactions with the dielectric glass before the dielectric has a chance to crystallize and mature. Higher softening point conductor glasses are less desirable, as shown in Example 9, where a high silica, modified lead borosilicate frit is employed. The dilatometer softening point of the conductor glass frit was above 600° C., and cofired aged adhesion was improved to 16N, but was still not as high as the 20–30N level of many of the other examples. In Example 10, a low softening point, zinc-lead borosilicate-type frit was used. However, the heavy ZnO modification moved the glass composition away from the more desirable claimed chemistry, and the cofired aged adhesion was very low.

The upper limit to the conductor glass softening point is about 800° C., though a preferred upper limit is 600° C. In this study, a lower limit was not found, and some glass composition of the preferred chemistry were used that had dilatometer softening points below 300° C.— see Table 2.

Bismuth oxide is almost always present in solderable silver compositions because of its well known benefit for improving solderability. Bismuth oxide can be present in a bismuth containing glass or glasses, or it can be added separately to the conductor formulation. In Examples 3–8, it is present in the glass frit; in Examples 1 and 2, it is added separately as the phase bismuth oxide; in Examples 9, 11 and 12, it is added separately as bismuth resinate. However, it is not necessary to employ bismuth oxide in the formulation (in a glass or as a separate addition) for the cofire technique to work. A practical, bismuth oxide-free formulation would need a minimum of glass frit to obtain adequate solderability.

The cofire technique and method of conductor formulation is not limited to a narrow class of dielectric compositions. Several dielectric examples have been used in Examples 1–12, that are described in more detail in copending U.S. patent applications Ser. No. 07/653872, and Ser. No. 07/653,874, both filed on Feb. 8, 1991. They employ crystallizing glasses, or crystallizing glasses plus added ceramic filler particles. Also, the use of commercial crystallizing thick film compositions QS482 (DuPont) and AP5576 (Asahi Glass) are shown in Examples 13 and 14. Again, the cofire technique was useful in developing high bond strengths after aging with the claimed conductor compositions.

As described above, the cofire technique is especially useful when used with crystallizing dielectric compositions. However, it can also be used with glass or filled glass compositions that do not crystallize appreciably, as shown in Example 15 where the dielectric is the commercial product 5704 (DuPont). In this example, the conductor composition develops both good cofired aged adhesion as well as good sequential aged adhesion because of the minimum amount of dielectric crystallization.

The cofire process requires that the conductor exhibit minimum shrinkage during firing to avoid separation from the dielectric. This phenomena is well known in the field of multilayer capacitors, where the electrodes are cofired with the dielectric layers. The shrinkage can be minimized with the use of sintering inhibitors, such as the ruthenium or rhodium-based materials described above. Also, the metal powder has a large impact of the shrinkage. The powder surface area is the driving force for sintering, so that a low surface area powder is preferable. A practical low limit for silver is about $0.1$ $m^2/g$; below this value, the powder is typically too coarse to give acceptable surface cosmetics for microcircuit applications. Above about 3 $m^2/g$, the shrinkage is excessive, leading to large scale separation and curling from the dielectric. In Example 16, some curling was observed after cofiring, making the cofire technique unusable.

Another parameter of the silver powder that can affect separation from the dielectric during cofiring is its tap bulk density. Generally, the higher the tap density, the better the packing in the dried film, so that less shrinkage is needed to obtain the final desired density. Thus, the higher the tap density, the better for cofire applications. A practical low limit is 0.7 g/cc, though a preferred range is above 2 g/cc.

GLOSSARY OF TERMS

QS 482 and 5704 are tradenames for thick film dielectric pastes manufactured by E. I. du Pont de Nemours & Co., Wilmingon, Del.

AP 5576 is a tradename for crystallizable thick film dielectric pastes manufactured by Asahi Glass Company, Tokyo, Japan.

Bismuth Resinate is a tradename for bismuth-2-ethylhexoate containing 30% Bi manufactured by Mooney Chemicals, Inc., Cleveland, Ohio.

8826 is a tradename of Engelhard Corp., East Newark, N.J. for rhodium resinate containing 10% Rh.

A2575 is a tradename of Engelhard Corp., East Newark, N.J. for ruthenium resinate containing 24% Ru.

Pigment #211 is a tradename of The Sheppard Color Company, Cincinnati, Ohio for cobalt chrome aluminate.

We claim:

1. A method for making multilayer electronic circuits comprising the sequential steps of:
    A. applying to the exposed surface of a substrate comprising a plurality of alternating layers of inorganic dielectric material and thick film conductor a layer of thick film dielectric paste comprising finely divided particles of amorphous glass containing by weight at least 25% $SiO_2$ and having a softening point below the maximum firing temperature of step (3) hereinbelow;
    B. applying to the thick film dielectric layer of step A. a patterned layer of thick film conductor paste comprising finely divided particles of (1) a silver containing metal selected from Ag, alloys and mixtures of Ag with a minor amount of Pd and/or Pt and mixtures thereof, the silver-containing particles having a maximum particle size of 20 microns, a surface area of at least 0.1 $m^2/g$; (2) an amorphous glass binder having a Dilatometer softening point of 150°-800° C. comprising at least two metal oxides selected from PbO, $B_2O_3$, $SiO_2$ and $Bi_2O_3$ and up to 45% wt. of glass modifier selected from oxides of alkali metals, alkaline earth metals, transition metals, and mixtures thereof, (3) a sintering inhibitor selected from oxides of ruthenium and rhodium, mixtures and precursors thereof, the amount of the sintering inhibitor relative to the amount of conductive metal falling within the area defined by points A through D of FIG. 1, all of (1), (2) and (3) being dispersed in an organic medium; and
    C. air cofiring the applied layers of thick film dielectric and thick film conductive pastes to effect volatilization of the organic medium from both layers, softening of the glass binder and sintering of the metal particles in the thick film conductor layer and densification of the glass in the thick film dielectric layer.

2. The method of claim 1 in which the glass in the thick film dielectric layer is crystallizable at a temperature above the softening point of the glass binder in the thick film conductive layer.

3. The method of claim 1 in which the maximum particle size of the silver-containing particles is 10 microns.

4. The method of claim 1 in which the dilatometer softening point of the glass in the thick film conductor paste is 200°-600° C.

5. The method of claim 1 in which the binder in the thick film conductor paste is selected from lead borosilicate, bismuth borosilicate, bismuth lead borosilicate, bismuth borate, bismuth lead borate, bismuth lead silicate glasses and mixtures thereof.

6. The method of claim 1 in which the sintering inhibitor is copper bismuth ruthenate.

7. The method of claim 1 in which the sintering inhibitor is $RuO_2$.

8. The method of claim 1 in which the sintering inhibitor is ruthenium resinate.

9. The method of claim 1 in which the sintering inhibitor is rhodium resinate.

10. The method of claim 1 in which the dielectric glass remains amorphous upon firing.

11. The method of claim 1 in which the glass binder in the conductive layer remains amorphous upon firing.

* * * * *